United States Patent [19]

Eckersten et al.

[11] Patent Number: 6,104,250

[45] Date of Patent: Aug. 15, 2000

[54] METHOD AND AN APPARATUS FOR CONTROLLING AN OSCILLATOR FOR GENERATING A LINEAR FREQUENCY SWEEP BY USE OF A PHASE-LOCKED LOOP

[75] Inventors: Christer Eckersten, Järfälla; Joakim Olofsson, Uppsala, both of Sweden

[73] Assignee: Celsiustech Electronics AB, Jarfalla, Sweden

[21] Appl. No.: 09/214,005

[22] PCT Filed: Jun. 30, 1997

[86] PCT No.: PCT/SE97/01178

§ 371 Date: Feb. 22, 1999

§ 102(e) Date: Feb. 22, 1999

[87] PCT Pub. No.: WO98/00920

PCT Pub. Date: Jan. 8, 1998

[30] Foreign Application Priority Data

Jul. 2, 1996 [SE] Sweden ............................... 9602619-0

[51] Int. Cl.[7] ................. H03L 7/07; H03L 7/18; H03L 7/22; H03J 7/18

[52] U.S. Cl. ................... 331/2; 331/14; 331/16; 331/17; 331/18; 331/23; 331/25; 327/147

[58] Field of Search ............... 331/2, 4, 14, 16–18, 331/22, 23, 25; 327/147–150

[56] References Cited

U.S. PATENT DOCUMENTS

| | | | |
|---|---|---|---|
| 4,320,355 | 3/1982 | Kawagoe et al. | 331/2 |
| 4,488,123 | 12/1984 | Kurihara | 331/2 |
| 5,130,670 | 7/1992 | Jaffe | 331/2 |
| 5,233,351 | 8/1993 | Gregory et al. | 342/100 |

FOREIGN PATENT DOCUMENTS

2 228 380  of 1990  United Kingdom .

*Primary Examiner*—David Mis
*Attorney, Agent, or Firm*—Pollock, Vande Sande & Amernick

[57] ABSTRACT

A method and an apparatus for controlling a radar oscillator for use in the traffic field, in particular for a car radar, for generating a linear frequency sweep. A phase-locked linearization loop generates a linear frequency sweep controlling a phase-locked oscillator loop, which has a considerably broader bandwidth than the linearization loop.

13 Claims, 4 Drawing Sheets

METHOD AND AN APPARATUS FOR CONTROLLING AN OSCILLATOR FOR GENERATING A LINEAR FREQUENCY SWEEP BY USE OF A PHASE-LOCKED LOOP

BACKGROUND OF THE INVENTION

The present invention relates to a method and an apparatus for controlling a radar oscillator for generating a linear frequency sweep by employing a phase-locked loop. The method and the apparatus are intended for use in the traffic field, preferably in a radar of the FM/CW type, and can, for example, be part of a car radar system.

In the application fields mentioned above, it is desirable to achieve extremely linear frequency sweeps within a broad bandwidth area. Inadequacies of the controlled oscillator must not damage the linear sweep.

SUMMARY OF THE INVENTION

The object of the present invention is to provide a method and an apparatus which fulfil the desirable characteristics mentioned above. The object of the invention is achieved by a method and an arrangement which employ at least two phase-locked loops. One of the phase-locked loops, the linearization loop, is utilized to generate a linear frequency sweep and the other phase-locked loop, the oscillator loop, utilizing the linear sweep generated in the linearization loop as a reference signal.

According to the invention, two phase-locked loops are employed. One of the phase-locked loops, the linearisation loop, has a narrow bandwidth and provides considerable suppression of undesirable signals. The oscillator signal generated in the linearization loop is subsequently utilized in the second phase-locked loop, the oscillator loop, which has a much broader bandwidth. By virtue of the broad bandwidth of the oscillator loop, phase noise, among other things, is suppressed in the controlled oscillator.

According to the invention, the linearization loop advantageously has a bandwidth in the kHz range, typically between about 10 and about 100 kHz.

Furthermore, according to the invention the oscillator loop advantageously has a bandwidth in the MHz range, typically between about 5 and about 20 MHz, specifically about 10 MHz.

The oscillator frequency is preferably in the GHz range, typically between 70 and 80 GHz.

According to an advantageous method, the linear frequency sweep generated in the linearization loop is generated at a lower frequency than the oscillator frequency for the controlled oscillator. Thereby, the linearization loop is allowed to work more slowly, which places less demand on the components which are included in the linearization loop. The lower frequency for the linearization loop is advantageously between about 100 and 1000 MHz, preferably between about 500 and about 700 MHz.

According to an advantageous embodiment, the linearization loop comprises a phase detector, whose output by the intermediary of a loop filter is coupled to a control input on the oscillator of the linearization loop and whose one input is coupled to a clock reference and the other input is connected to the output on the oscillator of the linearization loop via a variable frequency divider. In this connection, the variable frequency divider advantageously consists of an l/n counter. The introduction of digital means allows an extremely linear ramp to be generated on the output of the oscillator of the linearization loop.

According to a preferred embodiment, the counting interval n of the l/n counter is adapted to be changed in a set pattern.

According to yet another embodiment of the arrangement according to the invention, the oscillator loop comprises a phase detector, whose output is coupled to the controlled oscillator via a loop filter and whose one input is connected to the output on the oscillator of the linearization loop via a first frequency divider and whose other input is connected to the output on a mixer via a second frequency divider, which mixer on the input side is connected to the output on the controlled oscillator and the output on another oscillator. Because of the large bandwidth of the oscillator loop, high suppression of phase noise in the oscillator is achieved. In addition, the oscillator frequency becomes independent of variations in the load impedance, so-called pulling.

BRIEF DESCRIPTION OF THE DRAWINGS

The invention will be described in more detail below by way of an embodiment with reference to the accompanying drawings, in which.

DETAILED DESCRIPTION OF THE PREFERRED EMBODIMENT(S)

Figure 1:
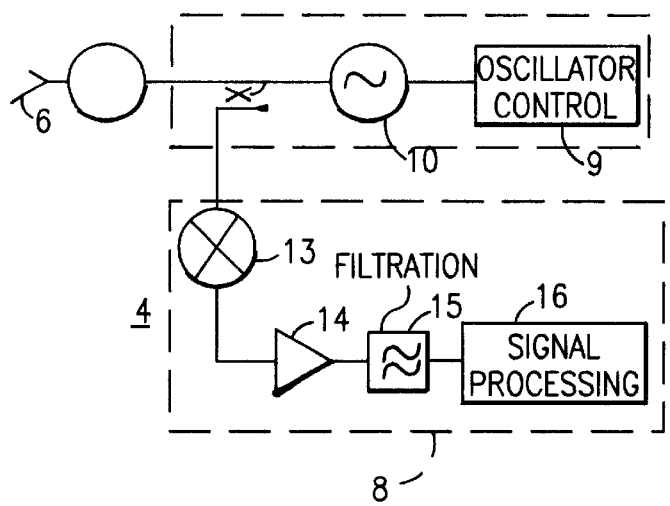
FIG. 1 shows a schematic block diagram of a radar arrangement with an arrangement according to the invention for controlling an oscillator.

The radar arrangement 4 shown in FIG. 1, which is suitable for use in car radar equipment, comprises an antenna 6, a transmitter part 7 and a receiver part 8. The radar arrangement preferably operates with FM/CW technology. The antenna 6 is preferably installed in the front of the vehicle. The transmitter part includes an oscillator control arrangement 9 and an oscillator 10. Preferably, the oscillator generates a signal in the gigahertz range, e.g. 77 GHz, which via a directional coupler 11 and a circulator 12 is supplied to the antenna 6. The oscillator 10 can consist of a Gunn diode oscillator or another oscillator which is suitable in these circumstances. The reflected signal received by the antenna is led by the intermediary of the circulator 12 to a mixer 13, where the signal received is mixed with the transmitted signal. After amplification 14, filtration 15 and signal processing 16, the distance r and the direction to the vehicle in front, among other things, can be obtained according to known radar principles, as well as information about the speed and acceleration of the vehicle in front if needed.

Figure 2:
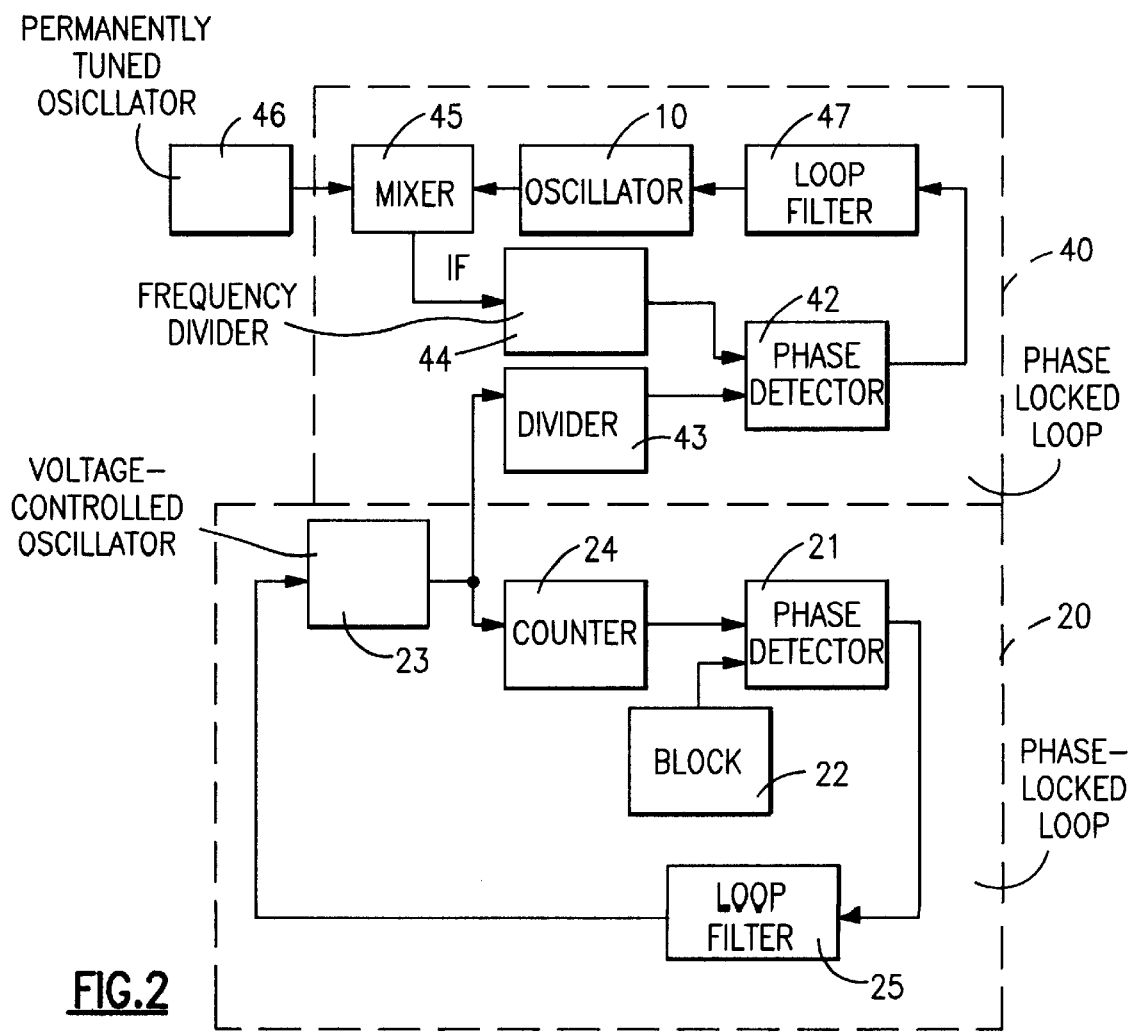
FIG. 2 shows, in the form of a schematic block diagram, an embodiment of an oscillator control arrangement according to the invention.

The oscillator control arrangement 9 in FIG. 2 comprises two phase-locked loops 20, 40, called here linearization loop 20 and oscillator loop 40. The linearization loop 20 includes a phase detector 21. The one input of the phase detector is connected to a reference signal $F_{ref}$ supplied by the block 22 and the other input is connected to the output of a voltage-controlled oscillator 23 via a frequency divider 24 in the form of an l/n counter. The output signal on the phase detector 21 controls the voltage-controlled oscillator 23 by the intermediary of a loop filter 25. The l/n counter 24 functions as a variable frequency divider. In coaction, the components included in the linearization loop generate a signal in the form of linear frequency sweeps on the output of the voltage-controlled oscillator 23 which ideally can have the appearance shown in FIG. 4.

Figures 4, 5:
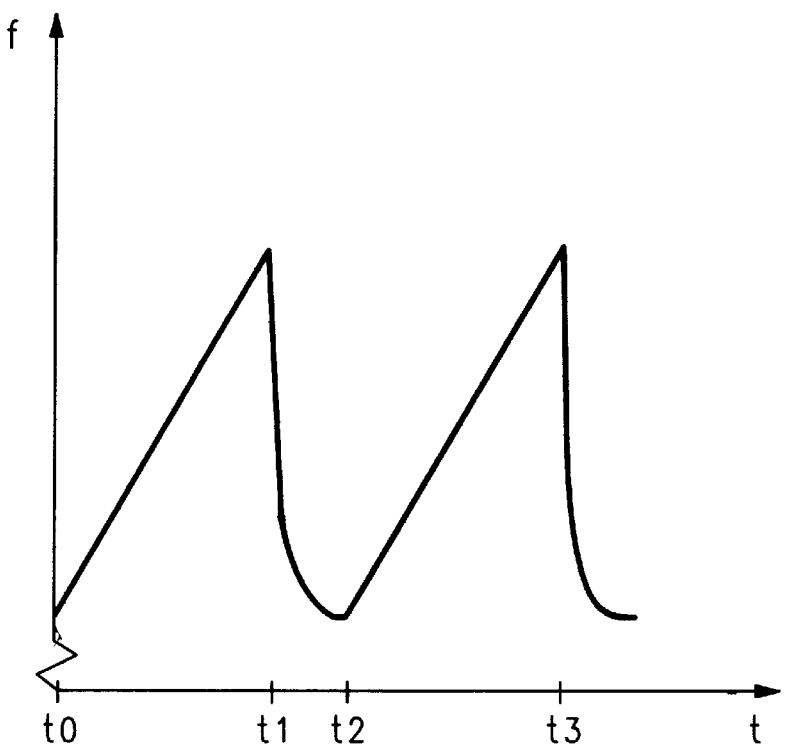
FIG. 4 shows an example of an ideally linear frequency sweep obtained from the linearization loop of the oscillator control arrangement to be used as a reference signal for the oscillator loop of the oscillator control arrangement.
FIG. 5 shows a table with examples of frequency values for an included voltage-controlled oscillator and the corresponding division factors.

According to FIG. 4, which shows the frequency f of the output signal on the voltage-controlled oscillator 23 as a function of time, ideally, a linear frequency sweep which starts at the time $t_0$ and ends at the time $t_1$ is achieved. At the time $t_1$, the signal returns to the starting level which applied at the time $t_0$ and then remains at this starting level until the time $t_2$ when a new frequency sweep is started which lasts until the time $t_3$. Then, the process is repeated in a corresponding manner.

The signal on the output of the voltage-controlled oscillator 23 is employed as a reference signal in the oscillator loop 40 and is supplied to the input on a phase detector 42 via of a frequency divider 43. The other input on the phase detector 42 is connected to a mixer 45 through of another frequency divider 44. One input of the mixer 45 is connected to the oscillator 10 and the other input is connected to a permanently tuned oscillator 46. An intermediate frequency signal IF is achieved on the output of the mixer 45. The phase detector 42 controls the oscillator 10 by the intermediary of a loop filter 47.

The oscillator control arrangement will be described below in more detailed block diagram form with reference to FIG. 3.

Figure 3A:
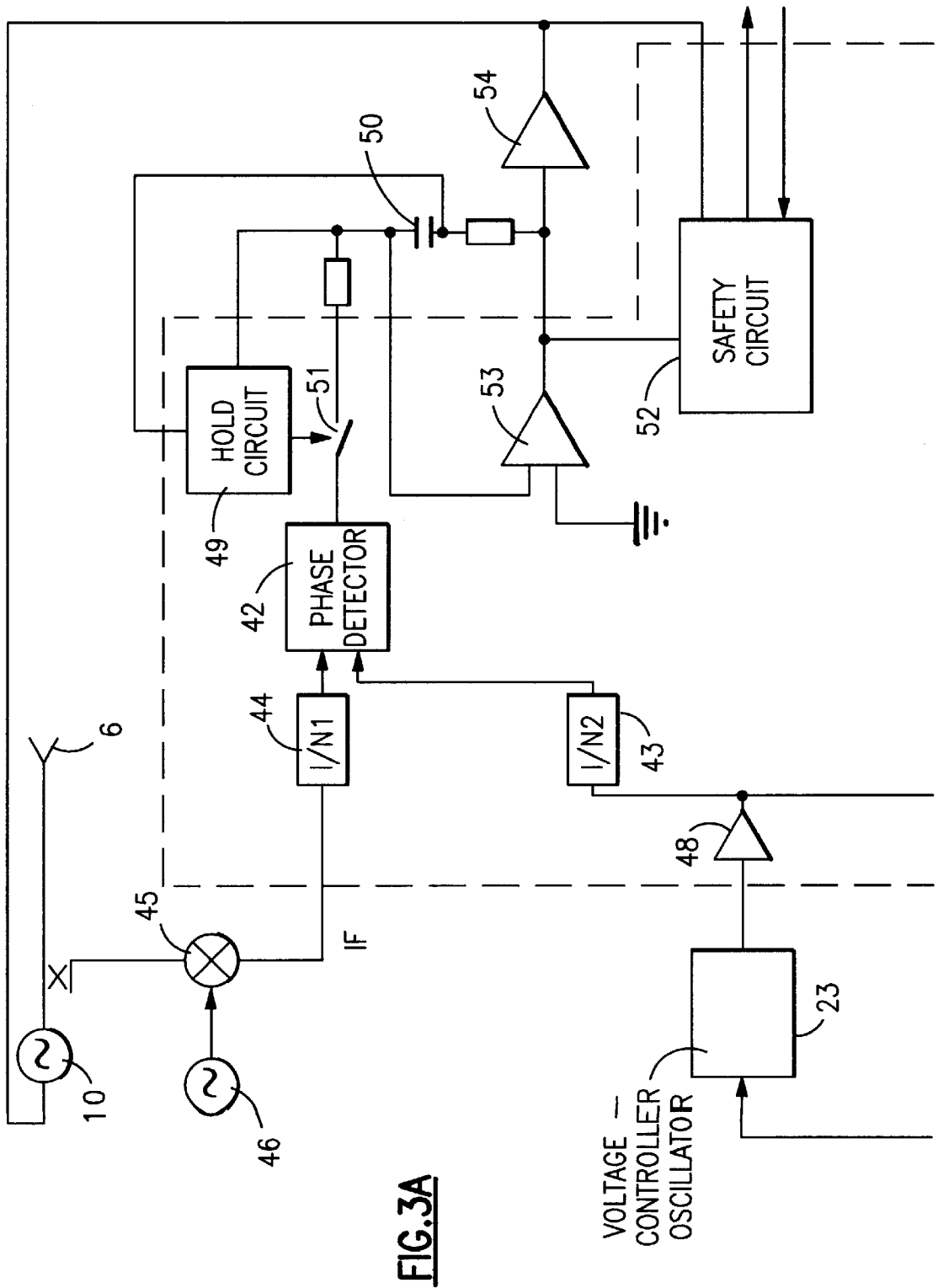
FIG. 3 shows the embodiment according to FIG. 2 in the form of a more detailed block diagram.
Figure 3B:
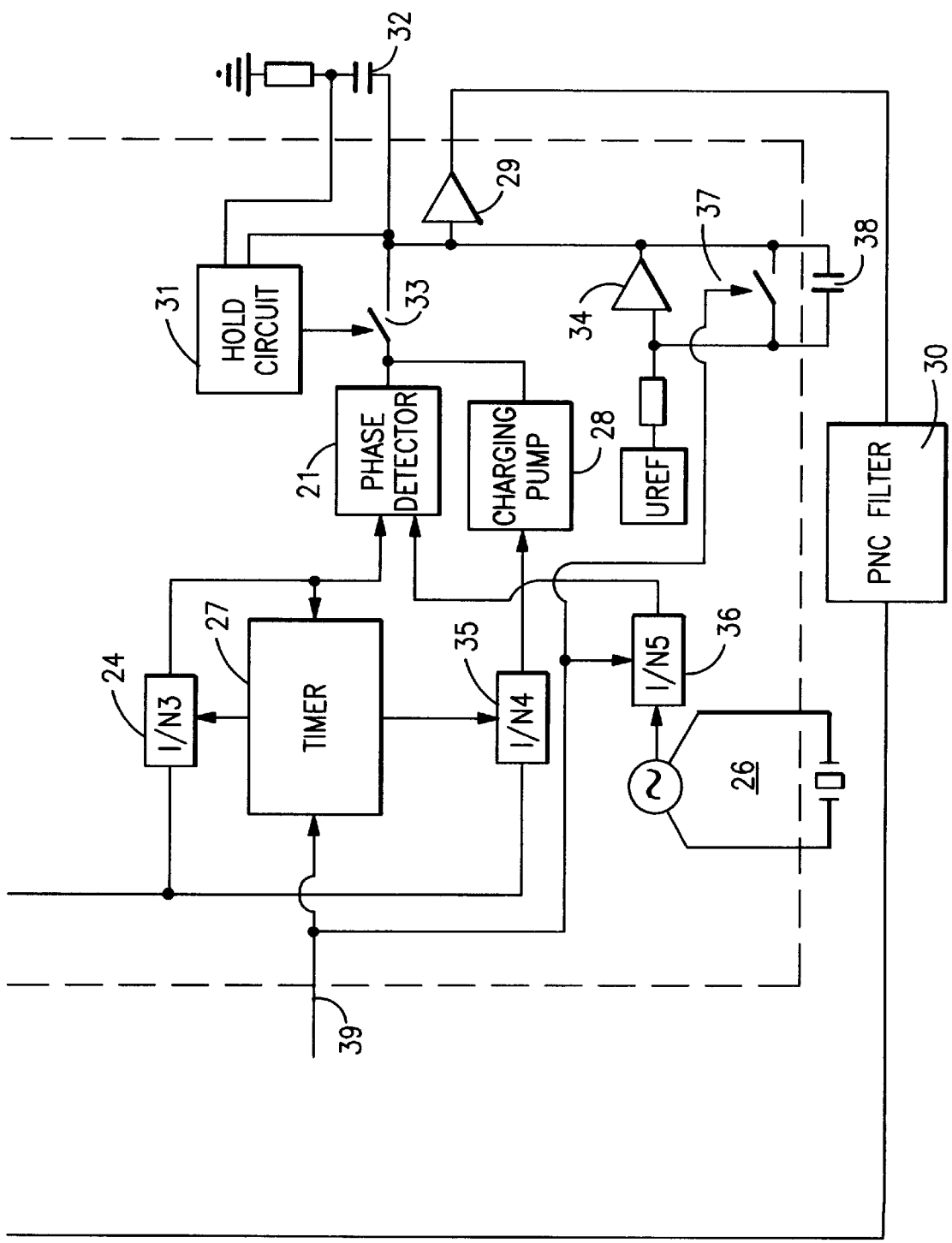

In accordance with FIG. 3, the output signal of the Gunn diode oscillator 10 is mixed with the output signal from the oscillator 46 in order to generate an intermediate frequency signal IF. The output signal of the oscillator 10 is suitably in the gigahertz range and the intermediate frequency signal generated is given a frequency below 1 GHz.

The intermediate frequency signal is divided by N1 in the frequency divider 44 and is fed to the phase detector 42 where the signal is compared with a signal from the voltage-controlled oscillator 23 functioning as a reference oscillator. The phase detector 42 generates an output signal in the form of an error signal which corrects the frequency of the Gunn diode oscillator. Prior to reaching the Gunn diode oscillator, the output signal of the phase detector 42 under goes filtration in a loop filter amplifier 53 and is isolated through a buffer amplifier stage 54.

In order to maximize the Q value of the oscillator 23, the oscillator circuit is based on a tuned L-C resonant circuit. A buffer amplifier 48 isolates the voltage-controlled oscillator 23 from the phase detector 42 and amplifies the output signal from the voltage-controlled oscillator. In this way, so-called pulling is prevented. A frequency divider 43 divides the output signal from the voltage-controlled oscillator by N2.

A sample and hold circuit 49 senses the control voltage on a capacitor 50 before the frequency sweep starts and charges the voltage back onto the capacitor when the frequency sweep is finished. The circuit 49 also opens the contact 51 when the sweep is over and closes the contact when the linearization loop has been locked in. By the use of the circuit 49 a quick return of the frequency of the Gunn diode oscillator is achieved and the transmission of unwanted frequencies during the locking period of the linearization loop is avoided.

In order to protect the Gunn diode oscillator against high transient voltages, there is a safety circuit 52 which earths the voltage if the voltage of the Gunn diode oscillator becomes too high.

In the linearization loop, the frequency sweep is achieved as follows. The oscillator signal isolated by the buffer amplifier 48 is fed to the frequency divider 24 in the form of an l/n counter which counts n steps (n=Nmin) and then gives a pulse to the phase detector 21. The phase detector compares the pulse with a clock reference from a crystal-controlled reference oscillator 26. In the embodiment shown, the reference oscillator 26 generates a high-frequency clock reference which is subsequently frequency divided to 1 MHz in a frequency divider 36. Subsequently, the counter 24 again counts to n=Nmin and gives off a pulse to the phase detector 21. The second pulse from the counter loads a new value into the counter, n=Nmin+1. Now, the counter counts an extra cycle before giving off the pulse to the phase detector, i.e. the voltage-controlled oscillator is forced to a higher frequency according to a set pattern. A number of other examples of set patterns are possible. This process continues until the timer 27 stops the process and subsequently loads the l/n counter with a pattern of bigger steps, which in a quick and controlled manner return the counter to the starting value n=Nmin. This value is maintained until the timer receives a synchronization signal on the input 39 and once again starts the counting procedure. In this context, it will be noted that the logic which controls the division factor n must be fast enough for the value n to be changeable without losing a cycle from the voltage-controlled oscillator. This means that a new value for n has to be loaded while the counter is counting. FIG. 5 shows a table with an example of some values of the desired oscillator frequency, the VCO frequency, and the division factor n. The first value of n in the table corresponds to the value Nmin mentioned above.

The output of the phase detector 21 consists of a charging pump with an output current $1_0$ which corrects the output voltage sweep of the error amplifier 29. The output signal is subsequently filtered in amplifilters and elliptic filters 30 to remove remainders of the clock reference from the reference oscillator 26 in the input voltage of the voltage-controlled oscillator.

When studying the table in FIG. 5, third line, one finds that the ratio between the desired VCO frequency and the division factor n is not 1 MHz. The counter 24 counts one quarter of a VCO period too little before giving off an output pulse to the phase detector 21. In order to compensate for this error, another charging pump 28 has been added to the block diagram. The charging pump 28 is to be active during a VCO period with an output current $1_0/4$. The compensation signal is supplied to every other output pulse from the counter 24. The supply of the compensation signal is controlled by the timer 27 in coaction with a counter 35 (1/N4 counter)

The loop bandwidth required depends on the linearity of the voltage-controlled oscillator 23, but 50 kHz is considered sufficient.

An alternative method for quickly restoring the frequency to the starting value is to employ a sample and hold circuit 31 which senses the voltage of a capacitor 32 when the frequency sweep starts. When the frequency sweep ends, a contact 33 is opened and the capacitor 32 is discharged until it reaches the voltage of the sample and hold circuit 31. Then, the contact 33 is closed and the loop tries to lock in the voltage-controlled oscillator 23. The circuit 31 supports the linearization loop during the frequency restoration after the frequency sweep and facilitates quick locking.

A ramp generator 34 integrates a direct current voltage Uref in order to generate a voltage ramp which is added to the control voltage. The voltage ramp is generated during the frequency sweep. When the sweep ends, a contact 37 is closed in order to discharge a capacitor 38 lying above the ramp generator 34. When the sweep starts, the contact should be open. The purpose of this ramp is to reduce the error signal from the phase detector 21 and to reduce the transient when the sweep starts.

What is claimed is:

1. A method for controlling a car radar oscillator of the FM/CW type for generating a linear frequency sweep by the use of a phase-locked loop, said method comprising the steps of:

forming at least two phase-locked loops, a first phase-locked loop being formed as a linearization loop, and being utilized to generate a repeated linear frequency sweep, and a second phase-locked loop being formed as an oscillator loop, the oscillator loop utilizing each linear frequency sweep generated in the linearization loop as a reference signal for controlling the oscillator frequency to provide a repeated linear oscillator frequency sweep, wherein the oscillator frequency is in the GHz range, the linearization loop is limited to a bandwidth in the kHz range, and the oscillator loop is limited to a bandwidth in the MHz range.

2. A method according to claim 1, further including limiting the linearization loop to a bandwidth between about 10 and 100 kHz, and limiting the oscillator loop to a bandwidth between about 5 and 20 Mhz, the oscillator frequency being between 70 and 80 Ghz.

3. A method according to claim 1, wherein the linear frequency sweep generated in the linearization loop is generated at a lower frequency than the oscillator frequency for the controlled oscillator.

4. A method according to claim 1, further including limiting the linearization loop to a bandwidth of about 50 kHz, and limiting the oscillator loop to a bandwidth between about 5 and 20 Mhz, the oscillator frequency preferably being between 70 and 80 Ghz.

5. An apparatus for controlling a car radar oscillator of the FM/CW type, for generating a linear frequency sweep by employing a phase-locked loop, the apparatus comprising at least two phase-locked loops, a first phase-locked loop, formed as a linearization loop, and adapted to generate a repeated linear frequency sweep and a second phase-locked loop, formed as an oscillator loop, and adapted to utilize each linear frequency sweep generated in the linearization loop as a reference signal for providing a repeated linear oscillator frequency sweep, the oscillator frequency being in the GHz range, the linearization loop having a bandwidth in the kHz range, and the oscillator loop having a bandwidth in the MHz range.

6. An apparatus according to claim 5, wherein the linearization loop has a bandwidth between about 10 and 100 kHz, and the oscillator loop has a bandwidth between about 5 and 20 MHz, the oscillator frequency being between 70 and 80 GHz.

7. An apparatus according to claim 6, wherein the linearization loop comprises a phase detector said phase detector having an output coupled via a loop filter to a control input on the oscillator of the linearization loop, and having one input coupled to a clock reference and the other input connected to the output on the oscillator of the linearization loop via a variable frequency divider.

8. An apparatus according to claim 7, wherein the variable frequency divider consists of an l/n counter.

9. An apparatus according to claim 8, wherein the counting interval n of the l/n counter is adapted to be changed in a set pattern.

10. An apparatus according to claim 5, wherein the oscillator loop comprises a phase detector, said phase detector having an output coupled to the controlled oscillator via a loop filter, and having one input connected to the output of the oscillator of the linearization loop via a first frequency divider and the other input connected to the output of a mixer via a second frequency divider, the mixer on an input side being connected to an output on the controlled oscillator and an output of another oscillator.

11. An apparatus according to claim 6, wherein the oscillator loop comprises a phase detector, said phase detector having an output coupled to the controlled oscillator via a loop filter, and having one input connected to the output of the oscillator of the linearization loop via a first frequency divider and the other input connected to the output of a mixer via a second frequency divider, the mixer on an input side being connected to an output on the controlled oscillator and an output of another oscillator.

12. An apparatus according to claim 7, wherein the oscillator loop comprises a phase detector, said phase detector having an output coupled to the controlled oscillator via a loop filter, and having one input connected to the output of the oscillator of the linearization loop via a first frequency divider and the other input connected to the output of a mixer via a second frequency divider, the mixer on an input side being connected to an output on the controlled oscillator and an output of another oscillator.

13. An apparatus according to claim 5, wherein the linearization loop has a bandwidth of about 50 kHz, and the oscillator loop has a bandwidth of about 10 MHz, the oscillator frequency preferably being between 70 and 80 GHz.

* * * * *